(12) United States Patent  
Bhattacharyya et al.

(10) Patent No.: US 7,492,030 B2  
(45) Date of Patent: Feb. 17, 2009

(54) TECHNIQUES TO CREATE LOW K ILD FORMING VOIDS BETWEEN METAL LINES

(75) Inventors: Arup Bhattacharyya, Essex Junction, VT (US); Paul A. Farrar, Okatie, SC (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/493,335

(22) Filed: Jul. 26, 2006

(65) Prior Publication Data

US 2006/0292858 A1 Dec. 28, 2006

Related U.S. Application Data

(62) Division of application No. 10/931,140, filed on Aug. 31, 2004, now Pat. No. 7,190,043, which is a division of application No. 10/198,586, filed on Jul. 18, 2002, now Pat. No. 6,903,001.

(51) Int. Cl.
*H01L 29/00* (2006.01)
*H01L 23/48* (2006.01)

(52) U.S. Cl. ...................... 257/522; 257/758

(58) Field of Classification Search .......... 257/522, 257/637, 641–644, 650, 758, 759, 762, E21.573, 257/E21.581, E23.013
See application file for complete search history.

(56) References Cited

U.S. PATENT DOCUMENTS

| | | | |
|---|---|---|---|
| 4,962,058 A | 10/1990 | Cronin et al. | |
| 5,461,003 A | 10/1995 | Havemann et al. | |
| 5,847,464 A | 12/1998 | Singh et al. | |
| 6,077,792 A | 6/2000 | Farrar | |
| 6,100,176 A | 8/2000 | Forbes | |
| 6,150,257 A | 11/2000 | Yin et al. | |
| 6,208,030 B1 | 3/2001 | Tsui et al. | |
| 6,309,946 B1* | 10/2001 | Givens | 438/421 |
| 6,387,824 B1 | 5/2002 | Aoi et al. | |
| 6,395,647 B1 | 5/2002 | Li et al. | |

(Continued)

OTHER PUBLICATIONS

Jin, C , "Evaluation of ultra-low-k dielectric materials for advanced interconnects", *Journal of Electronic Materials*, 30(4), (Apr. 2001),284-9.

(Continued)

*Primary Examiner*—Hung Vu
(74) *Attorney, Agent, or Firm*—Schwegman, Lundberg & Woessner, P.A.

(57) ABSTRACT

One aspect of the present subject matter relates to a method for forming an interlayer dielectric (ILD). In various embodiments of the method, an insulator layer is formed, at least one trench is formed in the insulator layer, and a metal layer is formed in the at least one trench. After the metal layer is formed, voids are formed in the insulator layer. One aspect of the present subject matter relates to an integrated circuit. In various embodiments, the integrated circuit includes an insulator structure having a plurality of voids that have a maximum size, and a metal layer formed in the insulator structure. The maximum size of the voids is larger than the minimum photo dimension of the metal layer such that a maximum-sized void is capable of extending between a first and second metal line in the metal layer. Other aspects are provided herein.

8 Claims, 13 Drawing Sheets

U.S. PATENT DOCUMENTS

| | | |
|---|---|---|
| 6,413,827 B2 | 7/2002 | Farrar |
| 6,413,852 B1 | 7/2002 | Grill et al. |
| 6,420,262 B1 | 7/2002 | Farrar |
| 6,451,712 B1 | 9/2002 | Dalton et al. |
| 6,509,590 B1 | 1/2003 | Farrar |
| 6,522,011 B1 | 2/2003 | Farrar |
| 6,524,944 B1 | 2/2003 | Rangarajan et al. |
| 6,534,835 B2 | 3/2003 | Farrar |
| 6,537,896 B1 | 3/2003 | Catabay et al. |
| 6,541,859 B1 | 4/2003 | Forbes et al. |
| 6,573,572 B2 | 6/2003 | Farrar |
| 6,617,239 B1 | 9/2003 | Farrar |
| 6,630,403 B2 | 10/2003 | Kramer et al. |
| 6,649,522 B2 | 11/2003 | Farrar |
| 6,656,822 B2 | 12/2003 | Doyle et al. |
| 6,677,209 B2 | 1/2004 | Farrar |
| 6,774,057 B1 | 8/2004 | Lu et al. |
| 6,956,289 B2 * | 10/2005 | Kunikiyo ............... 257/758 |
| 7,157,387 B2 | 1/2007 | Bhattacharyya et al. |
| 7,190,043 B2 | 3/2007 | Bhattacharyya et al. |
| 2001/0014528 A1 | 8/2001 | Clevenger et al. |
| 2002/0014679 A1 | 2/2002 | Lee et al. |
| 2002/0168872 A1 | 11/2002 | Farrar |
| 2003/0015781 A1 | 1/2003 | Farrar |
| 2003/0127741 A1 | 7/2003 | Farrar |
| 2003/0181018 A1 | 9/2003 | Geusic et al. |
| 2004/0161922 A1 * | 8/2004 | Gallagher et al. ........... 438/623 |
| 2005/0029609 A1 | 2/2005 | Bhattacharyya et al. |

OTHER PUBLICATIONS

Pai, C S., et al., "A manufacturable embedded fluorinated SiO/sub 2/ for advanced 0.25 mu m CMOS VLSI multilevel interconnect applications", *Proceedings of the IEEE 1998 International Interconnect Technology Conference*, (1998),39-41.

Saggio, M., "Innovative Localized Lifetime Control in High-Speed IGBT's", *IEEE Electron Device Letters*, 18(7), (1997),333-335.

Seager, C H., et al., "Electrical properties of He-implantation-produced nanocavities in silicon", *Physical Review B (Condensed Matter)*, 50(4), (Jul. 15, 1994),2458-73.

Tamaoka, E, et al., "Suppressing oxidization of hydrogen silsesquioxane films by using H/sub 2/O plasma in ashing process", *Proceedings of the IEEE 1998 International Interconnect Technology Conference*, (1998),48-50.

Treichel, H, "Low dielectric constant materials", *Journal of Electronic Materials*, 30(4), (Apr. 2001),290-8.

Weldon, M K., et al., "Mechanism of silicon exfoliation induced by hydrogen/helium co-implantation", *Applied Physics Letters*, 73(25), (Dec. 21, 1998),3721-3.

Zhang, F, "Nanoglass/sup TM/ E copper damascene processing for etch, clean, and CMP", *Proceedings of the IEEE 2001 International Interconnect Technology Conference*, (2001),57-9.

* cited by examiner

TECHNIQUES TO CREATE LOW K ILD FORMING VOIDS BETWEEN METAL LINES

CROSS REFERENCE TO RELATED APPLICATIONS

This application is a divisional of U.S. application Ser. No. 10/931,140, filed Aug. 31, 2004, now U.S. Pat. No. 7,190,043 which is a divisional of U.S. application Ser. No. 10/198,586 filed Jul. 18, 2002 now U.S. Pat. No. 6,903,001 which are incorporated herein by reference.

This application is related to the following commonly assigned U.S. patent application which is herein incorporated by reference in its entirety: "Low K Interconnect Dielectric Using Surface Transformation," Ser. No. 10/106,915, filed on Mar. 25, 2002.

TECHNICAL FIELD

This disclosure relates generally to integrated circuits, and more particularly, to integrated circuit dielectrics.

BACKGROUND

The semiconductor industry continuously strives to reduce the size and cost of integrated circuits. With the progressive scaling of feature size and Vdd, there has been a continuous drive and challenge to reduce interconnect capacitance to improve performance, to contain noise and to reduce active power.

One method for measuring the performance of an integrated circuit uses the maximum clock speed at which the circuit operates reliably, which depends on how fast transistors can be switched and how fast signals can propagate. One particular problem confronting the semiconductor industry is that, as integrated circuit scaling continues, the performance improvement is limited by the signal delay time attributable to interconnects in the integrated circuit. According to one definition, integrated circuit interconnects are three-dimensional metal lines with submicrometer cross sections surrounded by insulating material. One definition of an interconnect delay is the product of the interconnect resistance (R) and the parasitic capacitance (C) for the interconnect metal to the adjacent layers. Because of the progressive scaling, the parasitic capacitance (C) has significantly increased due to closer routing of wires, and the interconnect resistance (R) has significantly increased due to a continuous reduction of the wire section.

The following approximations for various generations of integrated circuit technology illustrates this problem. For example, the delay in 0.7 μm technology is about 500 ps, in which about 200 ps seconds are attributable to gate delays and about 300 ps are attributable to interconnect delays. The delay in 0.18 μm technology is about 230 ps, in which about 30 ps are attributable to gate delays and about 200 ps are attributable to interconnect delays. As integrated circuit scaling continues, it is desirable to lower the interconnect RC time constant by using metals with a high conductivity. One high conductivity metal used to lower the RC constant is copper. The use of copper in 0.18 μm technology improves the interconnect delays to about 170 ps. However, even though the delay attributable to the gates continues to decrease as scaling continues beyond the 0.18 μm technology, the overall delay increases significantly because the interconnect delay is significantly increased. It has been estimated that as much as 90 percent of the signal delay time in future integrated circuit designs may be attributable to the interconnects and only 10 percent of the signal delay may be attributable to transistor device delays. As such, it is desirable to lower the interconnect RC time constant by using materials with a low dielectric constant (K) between co-planer and inter-planer interconnects.

Considerable progress has been made in recent years towards developing lower K interlayer dielectric (ILD) using inorganic and organic materials. For example, low-K dense materials are available having a K in a range between 2.5 and 4.1. Additionally, improved processes have been developed using silicon dioxide ($SiO_2$) (K=4) and Polyimide (K=3.7). $SiO_2$-based inorganic dielectrics have been preferred because they provide the thermal and mechanical stability and reliability required for multilevel interconnect integration requirements.

One direction for developing low-K dielectrics incorporates air into dense materials to make them porous. The dielectric constant of the resulting porous material is a combination of the dielectric constant of air (K≈1) and the dielectric constant of the dense material. As such, it is possible to lower the dielectric constant of a low-k dense material by making the dense material porous. Some of the recent developments in ILDs include fluorinated oxide (K=3.5), Spin-On-Glass Hydrogen Silisequioxane (SOG-HSQ) (K=2.7-3.3) and porous siloxane based polymer, also known as Nanoglass (K=2.2-2.3). The fluorination of dielectric candidates, such as Teflon®, achieve a K of about 1.9.

Current research and development is attempting to achieve a dielectric material with a K value around 2 and lower, by incorporating controlled porosity or voids (K=1) in an otherwise dense and mechanically and thermally stable material that is compatible with the interconnect metallurgy and which can be readily integrated with the currently adopted back-end-of-the-line (BEOL) processing and tooling.

Xerogels and Aerogels introduce voids of 5-10 nm in the SOG-HSQ materials to achieve K values less than 2. However, the material compositions and processing are not very reproducible due to the inherent presence of large amount of liquid solvents and non-solvents that need to be removed to create voids and due to shrinkages resulting in internal stress and cracking.

Processes to form porous polymers have been shown in previous work by Farrar (Method Of Forming Foamed Polymeric Material For An Integrated Circuit, U.S. Pat. No. 6,077,792; Method Of Forming Insulating Material For An Integrated Circuit And Integrated Circuits Resulting From Same, U.S. Ser. No. 09/480,290, filed Jan. 10, 2000; Polynorbornene Foam Insulation For Integrated Circuits, Ser. No. 09/507,964, filed Feb. 22, 2000). However, there are some applications where it is desirable to use inorganic porous structures.

The demands placed upon a process for producing a porous structure becomes more stringent as photolithographic dimensions are decreased. Currently, in a damascene metal process, the pores are formed in a layer of insulator prior to etching. Thus, the maximum pore size must be less than the minimum photo dimension, else some of the pores will be located between and connect two trenches. When the metal is deposited in the damascene trenches, the metal fills the pore and forms a short between the lines in two trenches. Thus, if the pores are formed before the metal layer is defined, the pores size distribution should shrink in the same ratio as the minimum feature size. These demands are illustrated in FIGS. 1 and 2.

FIG. 1 illustrates relatively small pores 102 and metal lines 104 and 106 formed in an insulator 108 using a damascene process. The pores 102 are smaller than the photo dimension of the lines 104 and 106. The pores 102 are formed before the metal is deposited, such that the metal 110 flows into some of the pores. However, the pores are small enough so that a short does not form between the metal lines.

FIG. 2 illustrates relatively large pores 202 and metal lines 204 and 206 formed in an insulator 208 using a damascene process. At least some of the pores 202 are larger than the photo dimension of the lines 204 and 206. The pores are formed before the metal is deposited, such that the metal flows into some of the pores. The metal 210 is capable of flowing through a pore and forming a short between the metal lines.

Therefore, there is a need in the art to provide an improved low-K dielectric insulator for interconnects.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. Other embodiments may be utilized and structural, logical, and electrical changes may be made without departing from the scope of the present subject matter. The following detailed description is, therefore, not to be taken in a limiting sense, and the scope of the present subject matter is defined only by the appended claims, along with the full scope of equivalents to which such claims are entitled.

The present subject matter introduces micro-voids and/or nano-voids within a conventionally processed ILD (such as oxides, fluorinated oxide, SOG-HSQ and the like) to achieve K values in the range of 2-3 or lower without adversely affecting thermal and mechanical stability when the pores are formed after the film is deposited. The present subject matter introduces pores into the dielectric after the metal layer is defined, as illustrated below with respect to FIG. 3.

Figure 1:
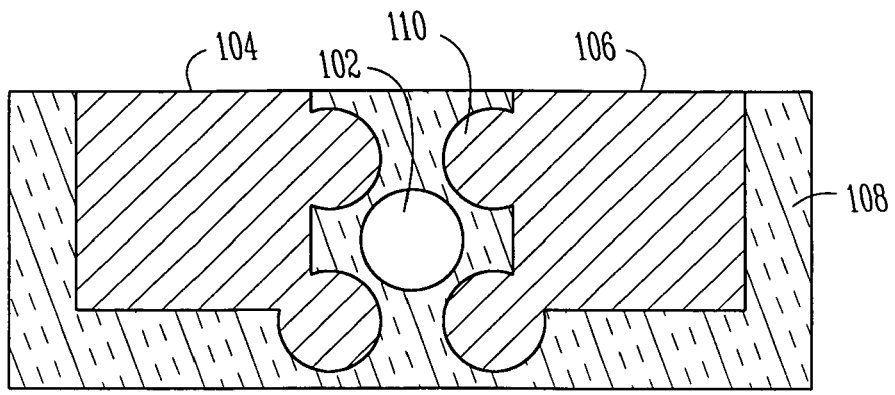
FIG. 1 illustrates relatively small pores and metal lines formed in a damascene process.
Figure 2:
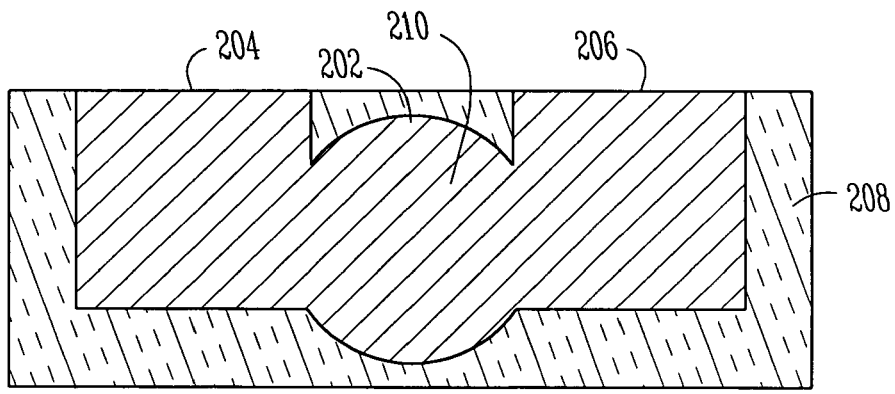
FIG. 2 illustrates relatively large pores and metal lines formed in a damascene process.
Figure 3:
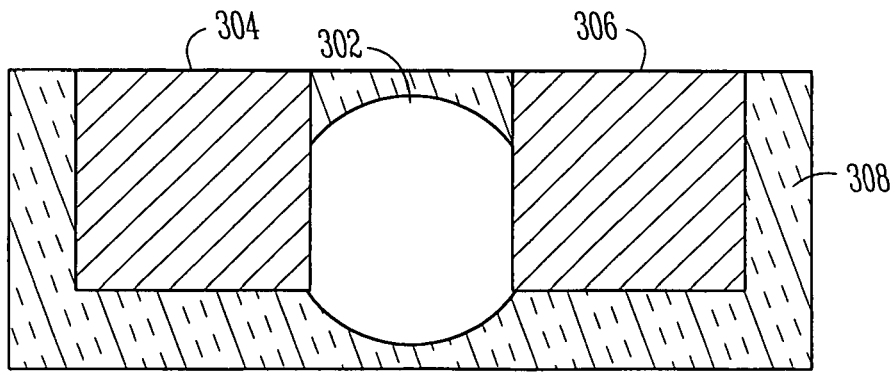
FIG. 3 illustrates an integrated circuit in which relatively large pores are formed after the metal lines are formed according to various embodiments of the present subject matter.

FIG. 3 illustrates an integrated circuit in which relatively large pores 302 are formed in the insulator 308 after the metal lines 304 and 306 are formed according to various embodiments of the present subject matter. The pores 302 are capable of being larger than the photo dimension of the lines 304 and 306 because they are formed after the metal is deposited. As such, no short occurs even if the pores extend from one line to another line because air is a good insulator.

As is described below, a number of process schemes are used in various embodiments of the present subject matter. In a first scheme, the insulator is a multi-phase structure. After the insulator is patterned, at least one of the phases is removed leaving the matrix phase intact. The intact matrix phase continues to provide structural rigidity and the spaces where the second (or multiple phases in the case of three phase or more complex structure) are now filled with air or other gas. A second process scheme introduces a gas phase (e.g. an inert gas such as helium (He), argon (Ar), or nitrogen ($N_2$)) into the insulator after it is in the solid state. The introduced gas phase also can include air. In various embodiments of this scheme, an inert gas (e.g. He, Ar, $N_2$) is implanted into the post-processed insulator to create stable voids (microvoids or nanovoids) resulting in a two-phase insulator-gas (void) structure.

Figure 4:
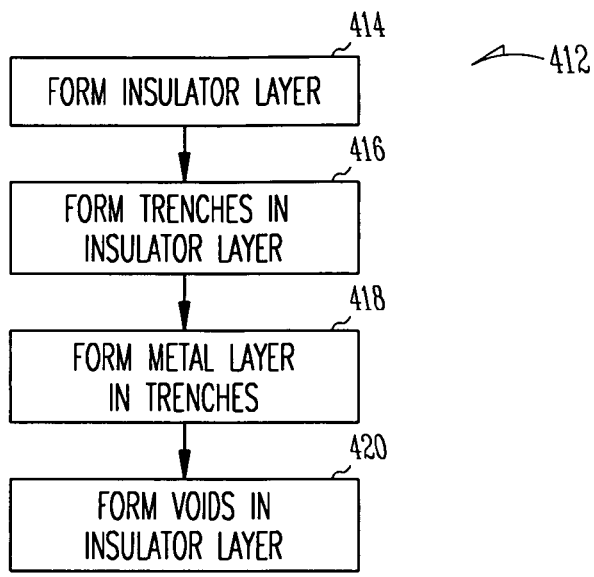
FIG. 4 illustrates a method for forming an interlayer dielectric (ILD) according to various embodiment of the present subject matter.

FIG. 4 illustrates a method for forming an interlayer dielectric (ILD) according to various embodiment of the present subject matter. According to the illustrated method 412, an insulator layer is formed at 414, trenches are formed in the insulator layer at 416, and a metal layer is formed in the trenches at 418. According to various embodiments, the insulator layer is formed from an inorganic material. One of ordinary skill in the art will understand, upon reading and comprehending this disclosure, that the metal layer is appropriately connected to various devices to form an integrated circuit. After the metal layer is formed at 418, voids are formed in the insulator layer at 420. Because the voids are formed after the metal layer is formed, the voids that are larger than the photo dimension of the metal layer will not cause a short between metal lines.

Figure 5:
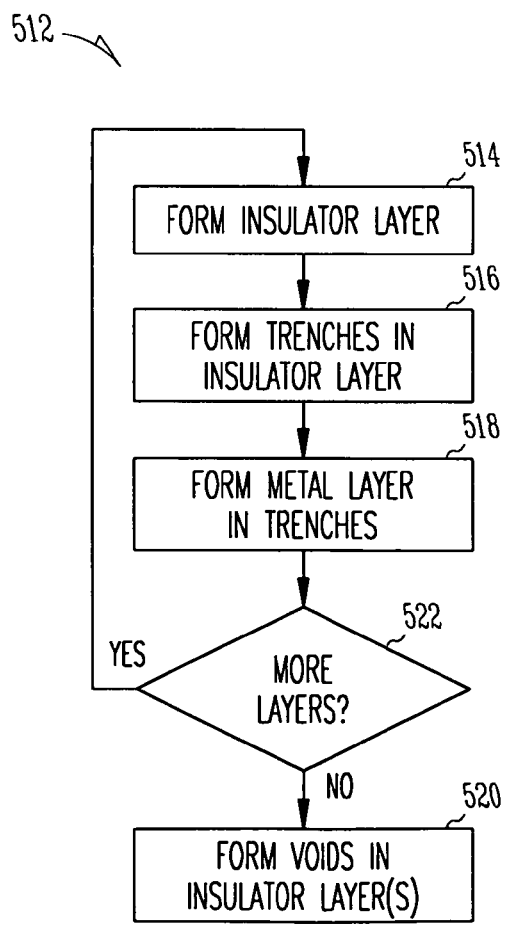
FIG. 5 illustrates a method for forming an ILD according to various embodiment of the present subject matter.

FIG. 5 illustrates a method for forming an ILD according to various embodiment of the present subject matter. According to the illustrated method 512, an insulator layer is formed at 514, trenches are formed in the insulator layer at 516, and a metal layer is formed in the trenches at 518. At 522, the process returns to 514 if additional metal layers are to be formed. Thus, an ILD structure having more than one metal layer is capable of being formed. If no additional layers are to be formed, the process proceeds to 520 where voids are formed in one or more of the insulator layers. In this embodiment, voids are capable of being formed in more than one insulator layer after the last metal layer has been formed.

Figure 6:
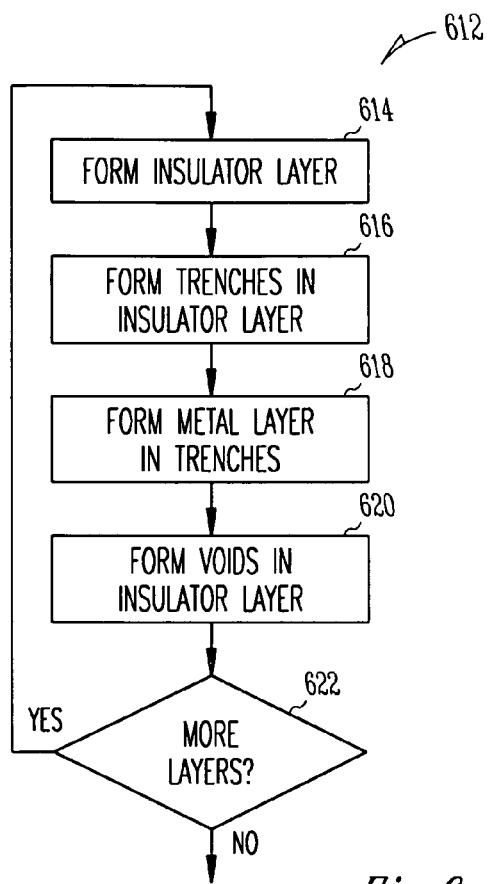
FIG. 6 illustrates a method for forming an ILD according to various embodiment of the present subject matter.

FIG. 6 illustrates a method for forming an ILD according to various embodiment of the present subject matter. According to the illustrated method 612, an insulator layer is formed at 614, trenches are formed in the insulator layer at 616, and a metal layer is formed in the trenches at 618. The process proceeds to 620 where voids are formed in the insulator layer. At 622, the process returns to 614 if additional metal layers are to be formed. Thus, an ILD structure having more than one metal layer is capable of being formed. In this embodiment, the voids are formed after each metal layer is formed as the ILD structure is being built.

One of ordinary skill in the art will understand, upon reading and comprehending this disclosure, that the methods illustrated in FIGS. 5 and 6 can be combined to intermediately form voids in one or more of the insulator layers as the ILD structure is being built. Thus, for example, voids are capable of being formed in the first and second insulator layers after the second metal level is formed, are capable of being formed in the third insulator layer after the third metal level is formed, and are capable of being formed in the fourth insulator layer after the fourth metal level is formed.

Process Scheme 1: Remove Phase(s) from Multi-Phase Insulator Structure.

Figure 7:
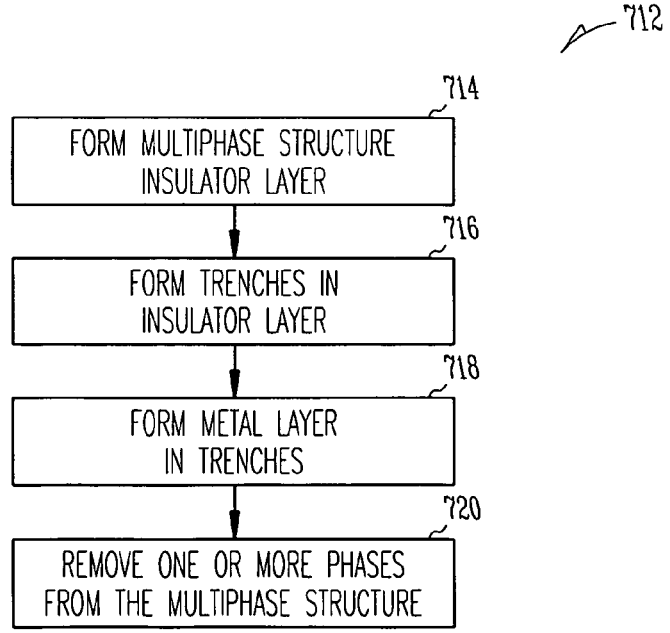
FIG. 7 illustrates a method for forming an ILD using a first process scheme according to various embodiments of the present subject matter.

FIG. 7 illustrates a method for forming an ILD using a first process scheme according to various embodiments of the present subject matter. According to the illustrated method 712, an insulator layer having a multiphase structure is formed at 714, trenches are formed in the insulator layer at 716, and a metal layer is formed in the trenches at 718. After the metal layer is formed at 718, voids are formed in the insulator layer at 720 by removing (or partially removing) one or more phases from the multiphase structure. Because the voids are formed after the metal layer is formed, the voids that are larger than the photo dimension of the metal layer will not cause a short between metal lines.

Figure 8:
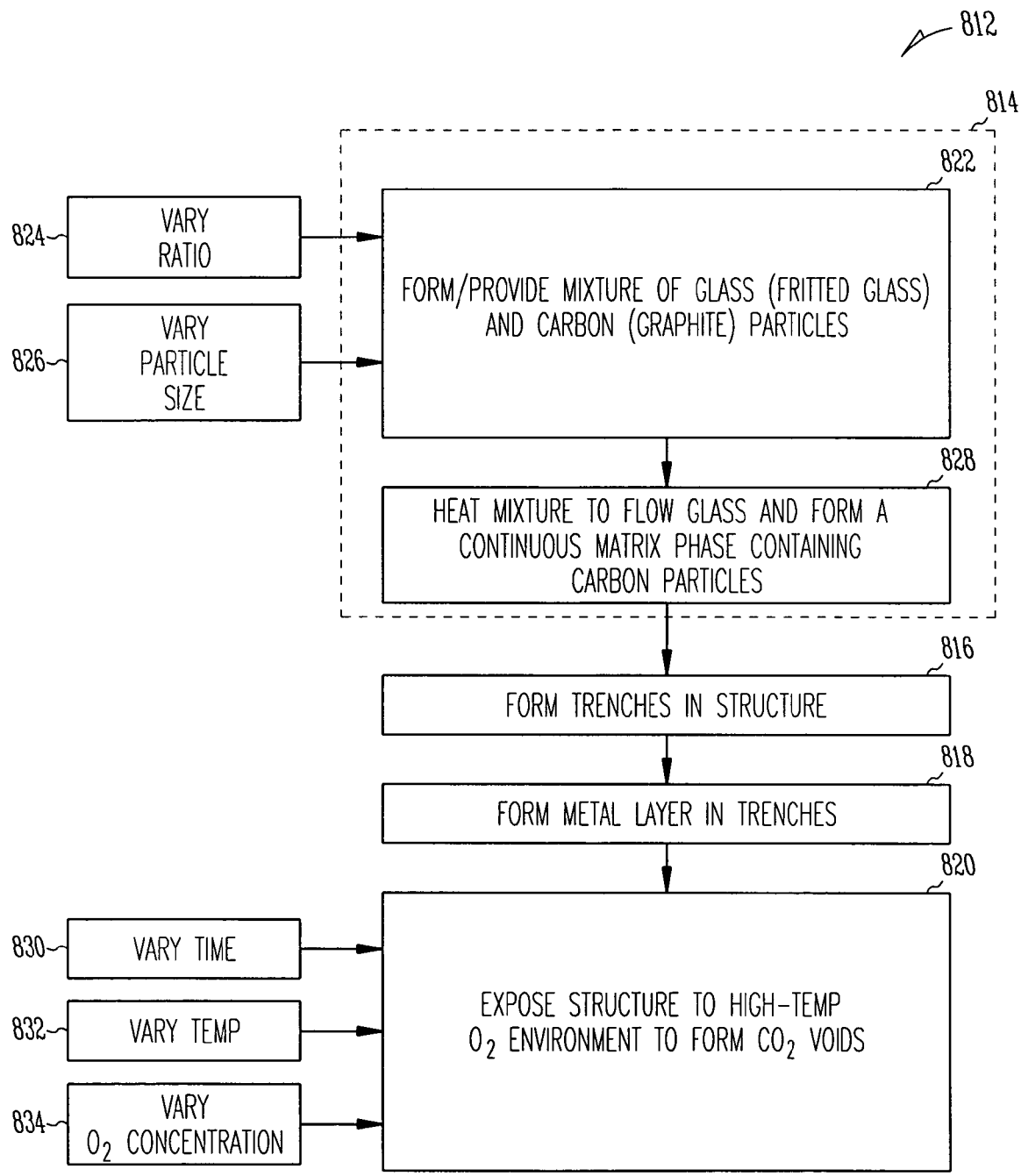
FIG. 8 illustrates a method for forming an ILD using a first process scheme according to various embodiments of the present subject matter.

FIG. 8 illustrates a method for forming an ILD using a first process scheme according to various embodiments of the present subject matter. According to the illustrated method 812, an insulator having a multiphase structure is formed at 814. In various embodiments, a mixture of glass particles and carbon particles is formed or otherwise provided at 822. In various embodiments, the glass particles have a low-melting temperature, such as that provided by fritted glass. In various embodiments, the carbon particles are provided as graphite particles. At 824, the ratio of the carbon particles to the glass particles is capable of being varied or selected to achieve a desired pore density. At 826, the particle size of the carbon is capable of being varied or selected according to the desired thickness of the insulator layer. At 828, the mixture is heated to above the softening temperature of the glass until the glass flows and forms a continuous matrix phase that contains carbon particles.

Metal lines are formed in the insulator using a damascene process. Trenches are formed in the insulator at 816, and a metal layer is deposited in the trenches at 818. At 820, the resulting structure is exposed to a high temperature oxygen ($O_2$) containing environment. The oxygen diffuses through the glass matrix, oxidizes with carbon, and forms carbon dioxide ($CO_2$) voids in the insulator structure. Thus, the carbon phase of the multiphase structure is at least partially removed due to the diffusion of oxygen into the structure. The time of exposure is capable of being varied or selected at 830, the temperature of the environment is capable of being varied or selected at 832, and the $O_2$ concentration is capable of being varied or selected at 834.

The diffusion distance of the oxygen through the glass and between the carbon particles is minimal because the maximum size of the carbon particles is equal to the thickness of the film to be formed such that many particles extend through the film. A rapid thermal anneal (RTA) is used in various embodiments to minimize the temperature exposure to the underlying device structure. In various embodiments, the RTA includes a laser anneal. In various embodiments, the RTA includes a plasma anneal. In various embodiments, the elevated temperature of the environment is in a range from 400 to 500° C., or in various sub-ranges within 400 to 500° C.

Process Scheme 2: Create Gas Phase in Insulator Structure.

Figure 9:
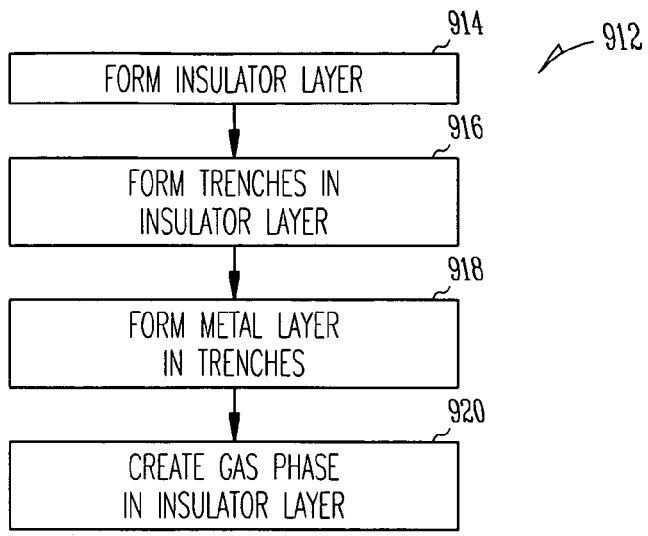
FIG. 9 illustrates a method for forming an ILD using a second process scheme according to various embodiments of the present subject matter.

FIG. 9 illustrates a method for forming an ILD using a second process scheme according to various embodiments of the present subject matter. According to the illustrated method 912, an insulator layer is formed at 914, trenches are formed in the insulator layer at 916, and a metal layer is formed in the trenches at 918. After the metal layer is formed at 918, voids are formed in the insulator layer at 920 by creating a gas phase in the insulator layer. Because the voids are formed after the metal layer is formed, the voids that are larger than the photo dimension of the metal layer will not cause a short between metal lines.

Figures 10, 11:
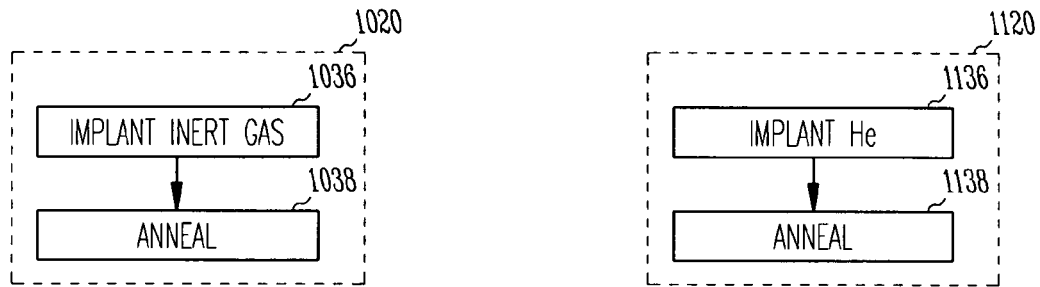
FIG. 10 illustrates a method for creating a gas phase in an insulator structure according to various embodiments of the present subject matter.
FIG. 11 illustrates a method for creating a gas phase in an insulator structure according to various embodiments of the present subject matter.

FIG. 10 illustrates a method for creating a gas phase in an insulator structure according to various embodiments of the present subject matter. The illustrated method is represented as 1020, and generally corresponds to element 920 in FIG. 9. According to the illustrated method 1020, an inert gas is implanted into the insulator layer at 1036, and the resulting structure is annealed at 1038.

FIG. 11 illustrates a method for creating a gas phase in an insulator structure according to various embodiments of the present subject matter. The illustrated method is represented as 1120, and generally corresponds to element 920 in FIG. 9. According to the illustrated method 1120, helium (He) (or another inert or non-reacting gas such as argon (Ar), nitrogen ($N_2$) and the like) is implanted into the insulator layer at 1136, and the resulting structure is annealed at 1138. Helium is used herein to simplify the disclosure. One of ordinary skill in the art will understand, upon reading and comprehending this disclosure, that the present subject matter is not limited to helium. Voids, such as nano-voids, are formed when implant induced vacancies and helium migrate and combine during the post-implant anneal.

Figure 12:
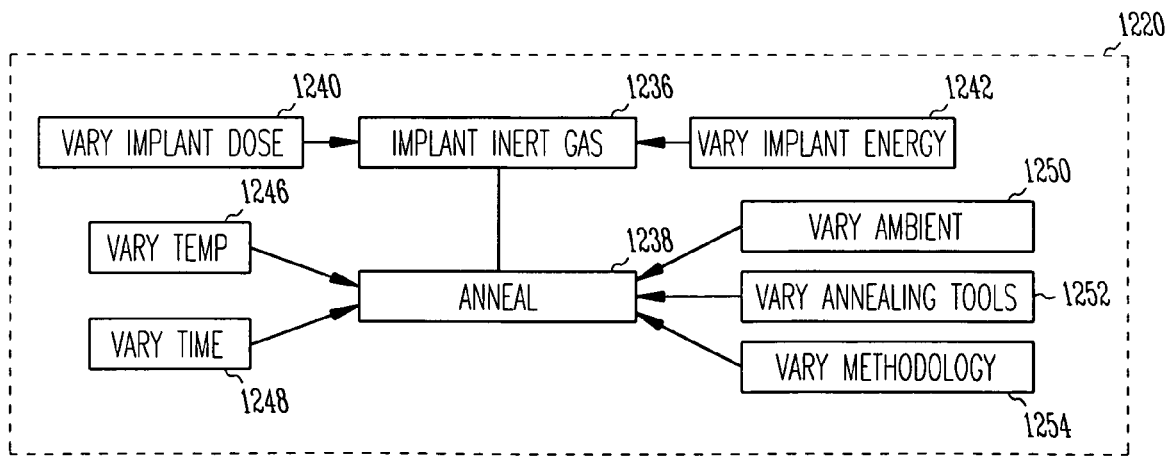
FIG. 12 illustrates a method for forming an ILD using a second process scheme according to various embodiments of the present subject matter.

FIG. 12 illustrates a method for forming an ILD using a second process scheme according to various embodiments of the present subject matter. The illustrated method is represented as 1220, and generally corresponds to element 920 in FIG. 9. According to the illustrated method 1220, helium (He) is implanted into the insulator layer at 1236, and the resulting structure is annealed at 1238.

The size and distribution of the voids are capable of being controlled by varying or selecting an implant dose at 1240 and an implant energy at 1242. Stable geometries are capable of being obtained by appropriately varying or selecting the post-implant annealing parameters, such as temperature at 1246, time at 1248, ambient (such as He, $N_2$, Ar and the like) at 1250, annealing tools at 1252, and annealing methodology at 1254.

In various embodiments, after the insulator is processed, a heavy dose of an inert gas is implanted in the processed insulator, and the resulting structure is annealed. For example, in various embodiments, a dose of helium (He) in excess of $2\times10^{15}/cm^2$ is implanted. Stable nano-cavities or nano-voids are generated inside of the ILD material. The voids are formed when implant induced vacancies and helium migrate and combine during the post-implant anneal.

The size and distribution of these voids are capable of being varied by varying the implant dose. Stable geometries are capable of being obtained by optimizing the post-implant annealing parameters, such as annealing temperature, time, ambient, annealing tools, and methodology. Multiple layers of these nanovoids are capable of being formed and stabilized by successive implants at different implant energies by placing helium and vacancy clusters at different depths of the material in which helium is ion implanted and the material is appropriately annealed.

Multiple layers of nano-voids, arranged with a desired geometry, are capable of being generated by implanting the inert gas at different depths of ILD by varying the implant energy and adjusting the dose and annealing tools and parameters. It has been shown that single and multiple layers of stable micro/nano cavities can be formed in silicon material by implanting a dose of helium greater than or equal to $2 \times 10^{15}$ at different implant energies followed by an appropriate anneal in an inert ambient. Stable multiple layers of spherical cavities, of 10 to 90 nm in diameters of similar shape, have been formed in silicon within the layer. The distance of separation between layers is from 110 nm to 120 nm.

The ILD layer is first produced by a back-end-of-line (BEOL) processing of silicon technology. A first layer of voids (helium or other ions) and associated vacancy cluster) is generated at a desired depth by appropriately selecting the dose and energy of the helium implant. The implanted structure is annealed in an inert ambient with an appropriate thermal budget (e.g. time, temperature and the like) to control and stabilize the geometry and distribution of the voids. In various embodiments, the inert ambient includes nitrogen. In various embodiments, the inert ambient includes argon.

In various embodiments, the thermal budget is contained and controlled by using appropriate rapid thermal annealing. In various embodiments, the thermal budget is contained and controlled by using laser pulse annealing. In various embodiments, the thermal budget is contained and controlled by using plasma annealing at a relatively low temperature.

Multiple layers of stable voids are capable of being formed at a desired depth inside the ILD material by repeating the implant and annealing with an appropriate implant energy. As described in the United States Patent Application entitled "Low K Interconnect Dielectric Using Surface Transformation," Ser. No. 10/106,915, filed on Mar. 25, 2002, which was previously incorporated by reference, a stable void fraction of greater than 0.5 is capable of being readily targeted within a $SiO_2$ ILD layer. An effective K value of ILD less than or equal to 1.5 is capable of being achieved by incorporating stable nan-voids in $SiO_2$ ILD. Therefore inter and intra-layer capacitance of BEOL interconnects are capable of being dramatically reduced and chip performance is capable of being significantly improved.

PROCESS EXAMPLES

Process examples are provided below to illustrate both the Process Scheme 1 and the Process Scheme 2. One of ordinary skill in the art will understand, upon reading and comprehending this disclosure, that these examples illustrate embodiments of the present subject matter, and that other structural embodiments and method embodiments are capable of being derived from these examples.

These examples relate to the construction of a four level metal structure, as shown in various stages of fabrication in FIGS. 13A through 13I and FIGS. 14A through 14I. The first and second metal levels of the structure are to have a minimum photolithographic dimension of 0.3 microns and a thickness of 0.6 microns. The third and fourth metal levels of the structure are to have a minimum photolithographic dimension of 0.7 micron and a metal thickness of 1.5 microns. The insulator thickness between the first and second metal levels as well as between the second and third metal levels is to be approximately 0.75 microns. The insulator thickness between the third and fourth metal levels is to be approximately 1.5 microns thick. Each insulator layer is to be formed with a pore density of 40 percent voids.

Example For Process Scheme 1

Figure 13A:
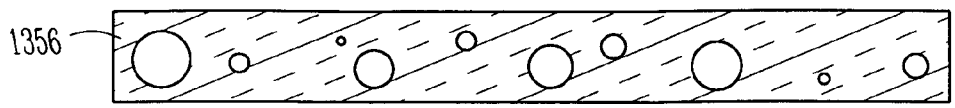
FIGS. 13A through 13I illustrate an example of forming an ILD using the first process scheme.

FIGS. 13A through 13I illustrate an example of forming an ILD using the first process scheme. A mixture of low melting point glass particles and carbon particles is deposited to form a first layer 1356, as shown in FIG. 13A. The carbon particles 1358 form about 40% of the mixture, and corresponds generally to the desired pore density of 40% voids. One of ordinary skill in the art will understand, upon reading and comprehending this disclosure, that the illustrated carbon particles are for purposes of illustration only. The maximum particle size of the carbon is about 0.6 microns. The first layer of the mixture is heated such that the glass particles flow, resulting in a first insulator layer of carbon-containing glass that is 0.6 microns thick. The thickness of the glass generally corresponds to the maximum size of the carbon particles.

Figure 13B:
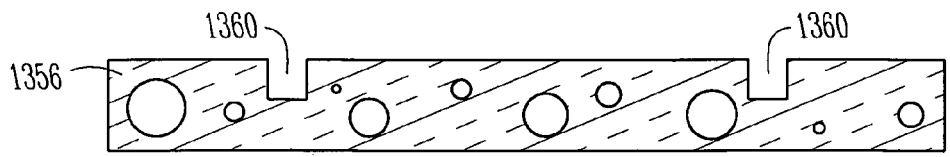
Figure 13C:
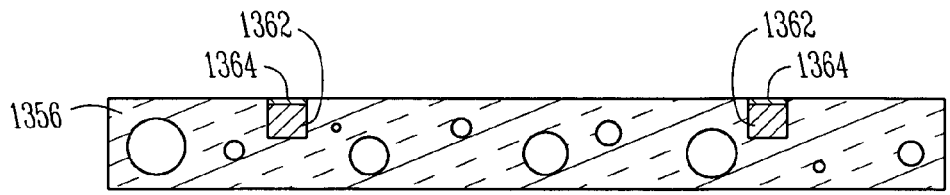

Trenches 1360 (0.3 micron) are cut into the film 1356 in FIG. 13B. In FIG. 13C, the liner and copper layer 1362 are deposited and planarized to form the metal layer. A capping layer 1364 is applied using a process as described by Farrar in the following commonly assigned U.S. patent application which is herein incorporated by reference in its entirety: "Method Of Fabricating A Barrier Layer On Top Surfaces Of Metals In Damascene Structures," Ser. No. 09/534,224, filed on Mar. 24, 2000. In this process the capping layer remains only on the metal surface so that the upper surface of the intralayer dielectric is not covered.

Figure 13D:
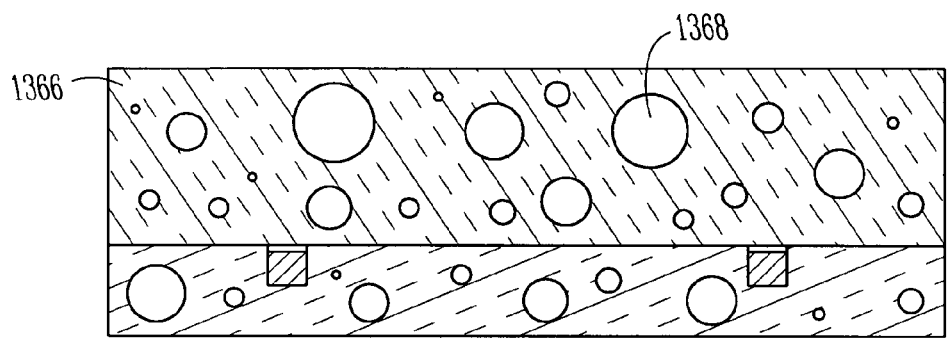
Figure 13E:
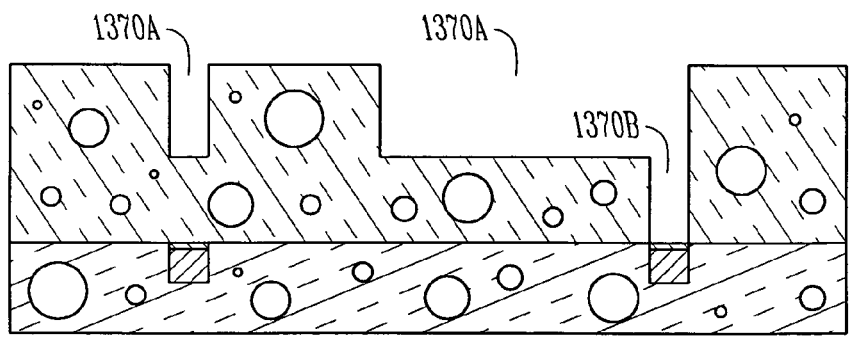
Figure 13F:
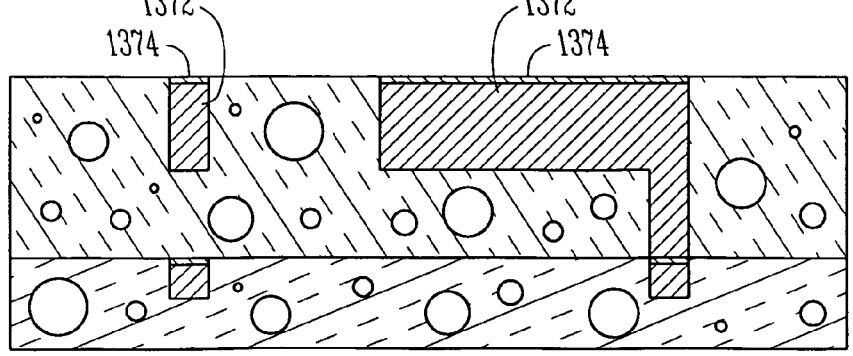

A second layer 1366 of insulator slurry with a maximum carbon particle 1368 of 1.35 microns is applied to form a carbon-containing 1.35 micron insulator layer, as shown in FIG. 13D. In FIG. 13E, the insulator layer 1366 is etched to provide a dual damascene trench 1370A and 1370B for the 0.6 micron second level metallurgy 1370A and the via structure 1370B for first to second level vias. As illustrated in FIG. 13F, the second level metallurgy is deposited using a similar process to that used in forming the first level metallurgy, so as to provide a liner and copper layer 1372 and a capping layer 1374.

Figure 13G:
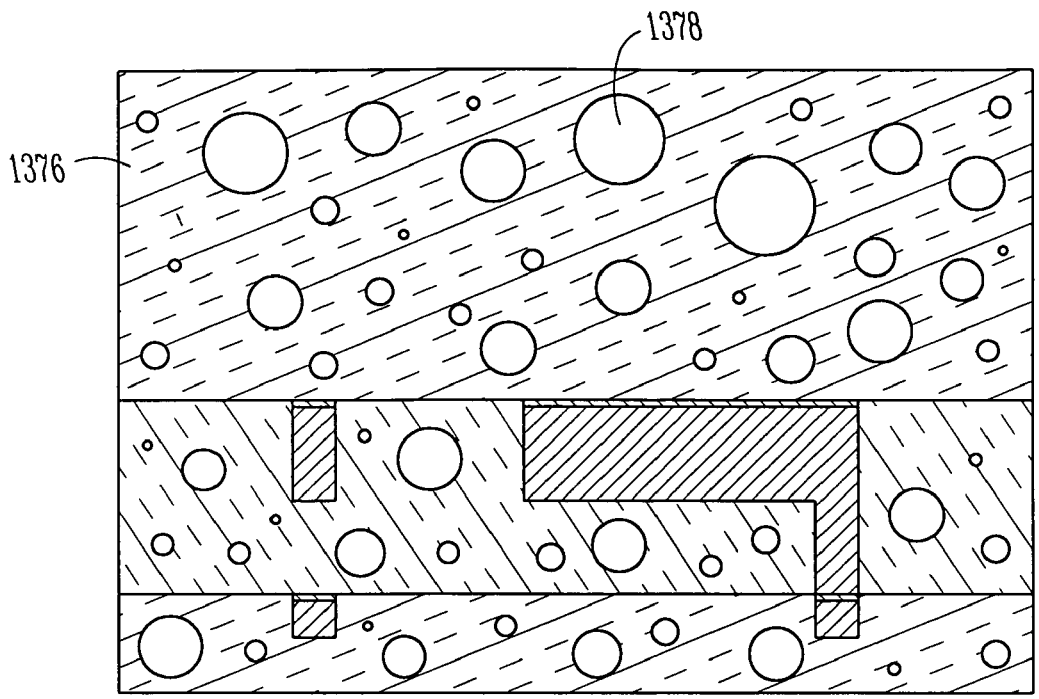
Figure 13H:
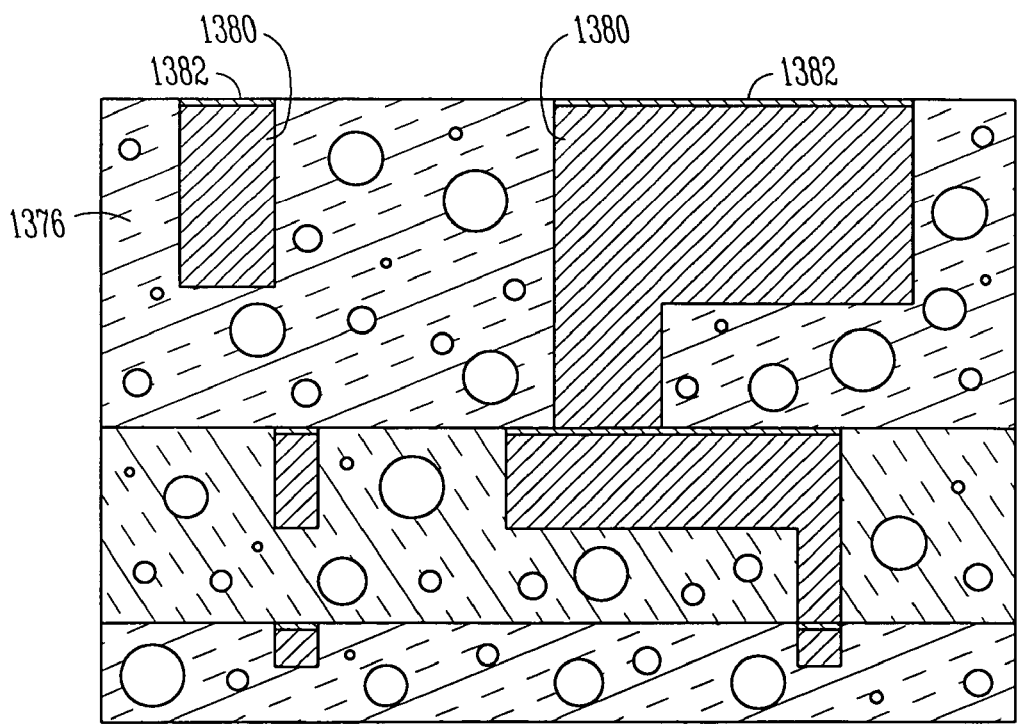

As illustrated in FIG. 13G, a third layer 1376 of insulating slurry with a maximum carbon particle 1378 size of 2.5 microns is deposited, forming a 2.5 micron insulator film. This insulator film is etched to form a dual damascene trench and for the 1.5 micron thick third level metallurgy and the 0.75 micron second to third level vias. As illustrated in FIG. 13H, the metallurgy is formed using a similar process as was used for the lower metal levels, so as to provide a liner and copper layer 1380 and a capping layer 1382.

Figure 13I:
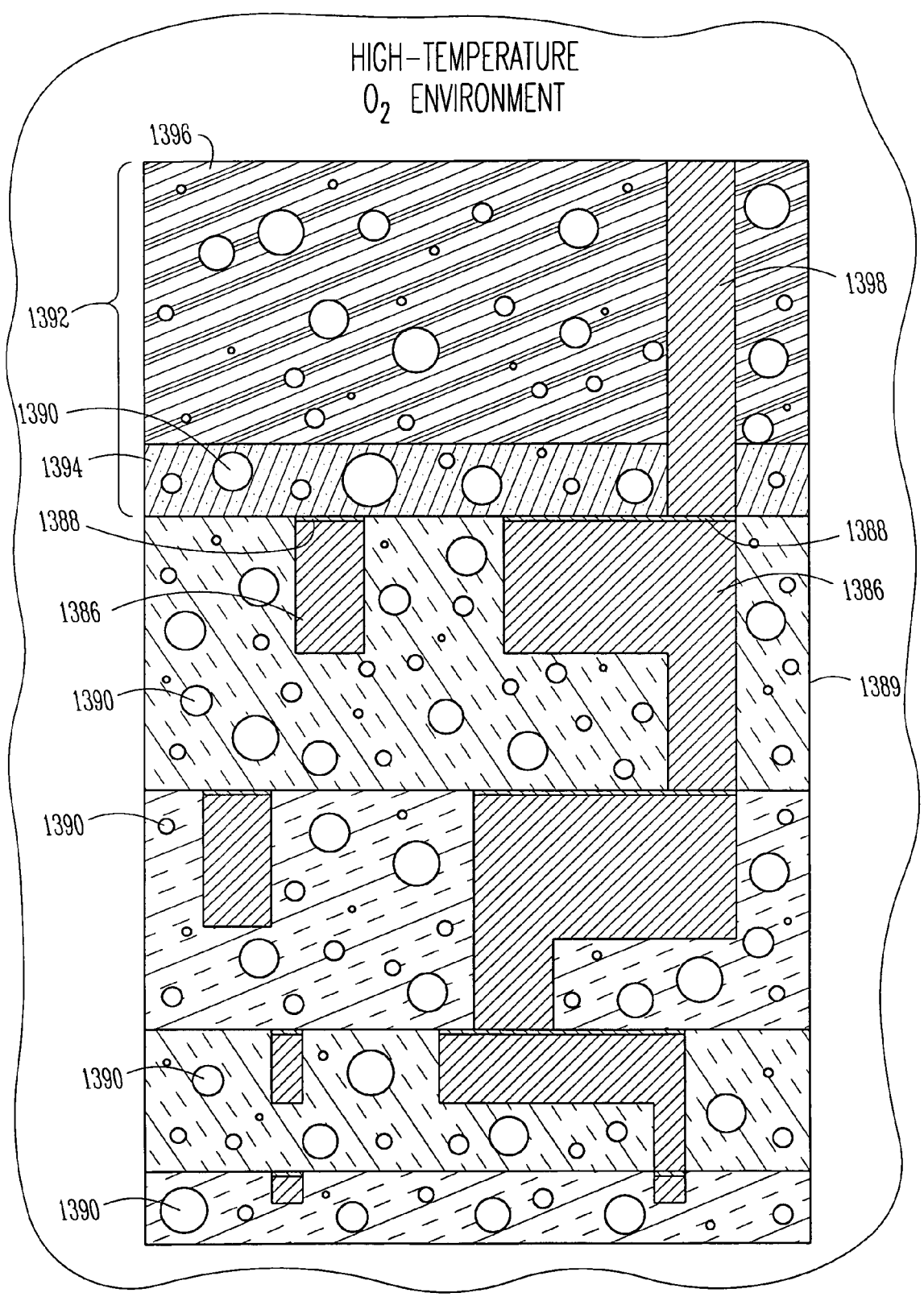

As illustrated in FIG. 13I, a fourth layer 1384 of insulating slurry with a maximum particle size of 3 microns is deposited, forming a 3 micron insulator film. This insulator film is etched to form a dual damascene structure for the 1.5 micron thick third level metallurgy and the 1.5 micron third to fourth level vias. The metallurgy is formed using a similar process as was used for the lower metal levels, so as to provide a liner and copper layer 1386 and a capping layer 1388.

The carbon is removed by exposing the film to an oxygen-containing ambient at an elevated temperature, resulting in $CO_2$ voids 1390 in the insulator structure. In various embodiments, the elevated temperature is approximately 450° C. In various embodiments, the elevated temperature is within a range from 400 to 500° C. In various embodiments, the elevated temperature is within various subranges within the range from 400 to 500° C. In each insulator level, the maximum particle size of the carbon particles is equal to the thickness of the insulator film to be formed. Thus, there are many particles that will extend through the film in each layer. Consequently, the diffusion distance of oxygen through the glass and between the carbon particles is minimal.

In various embodiments, a rapid thermal anneal (RTA) process is used to minimize the temperature exposure to the underlying device structure. In various embodiments, depending on the number of metal layers being constructed, it is desirable to perform one or more intermediate anneals to the partially completed structure to remove the carbon from the lower levels. These intermediate anneals shorten the diffusion path further.

A final passivation layer 1392 is capable of being built in a number of processes depending upon specific system requirements. Various embodiment use a 0.5 micron carbon glass layer 1394 which is deposited prior to the removal of the carbon in the lower composited films. The carbon is removed from this film at the same time as the rest of the structure. A 4 micron layer of Polyimide 1396 is applied as the final insulating layer. Vias 1398 are formed in the composite layer so that the terminal metallurgy can be connected. In various embodiments, the voids are formed by first etching the glass layer prior to the Polyimide layer being applied. In various embodiments, the voids are formed after the Polyimide is applied. The use of a thin composite layer under the thick Polyimide (which is highly viscose when applied), ensures that little if any Polyimide is able to fill the voids created between the fourth level metal lines.

Example For Process Scheme 2

FIGS. 14A through 14I illustrate an example of forming an ILD using the second process scheme. The following example assumes that the insulator used has a density similar to $SiO_2$. As one of ordinary skill in the art will understand, upon reading and comprehending this disclosure, the insulator (such as glass) can have a different density and ion stopping power such that different implant energies are required. The required over pressure is dependent on the softening point of the glass as well as the chosen annealing temperature.

Figure 14A:
FIGS. 14A through 14I illustrate an example of forming an ILD using the second process scheme.

In FIG. 14A, an insulator is deposited to form a 0.6 micron first insulator layer 1456. In various embodiments, the oxide is selected such that the softening point of the oxide is well below the melting point of the metal to be used for the conductors, and is preferably below 475 to 500° C. If a high temperature metallurgy, such as tungsten, is used, the limiting temperature is determined by the temperature that is compatible with the thermal budget of the device structure.

Figure 14B:
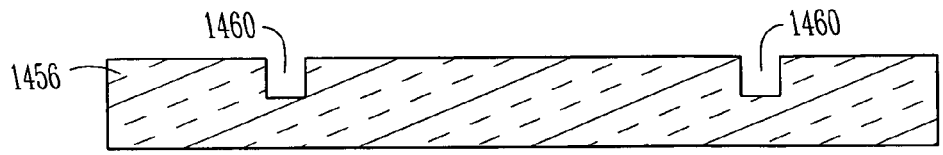
Figure 14C:
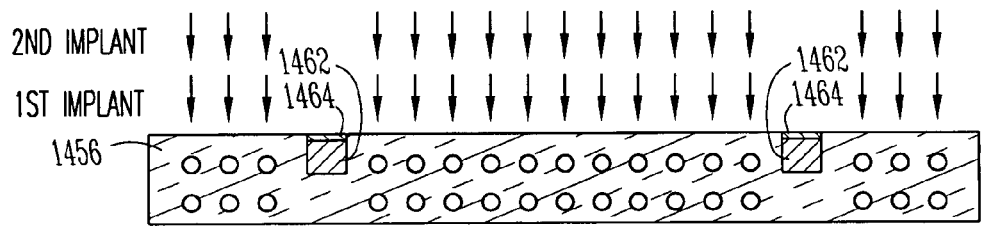

In FIG. 14B, trenches 1460 of 0.3 microns wide are etched into the oxide and the liner, copper metallurgy 1462 and capping layer 1464 are formed using the same process as in the first example.

In various embodiments, two implants are performed. A first implant of helium has a dose of about $5 \times 10^{15}/cm^2$ at an implant energy of about 10 KEV. A second implant has a dose of about $5 \times 10^{15}/cm^2$ at an implant energy of about 45 KEV. These two implants provide sufficient helium (He) to form 40 percent voids with about a 50 percent excess helium to allow for over pressure and helium loss during processing. The structure is annealed using a RTA process at a temperature and for a time sufficient to form the voids 1490. In various embodiments, the annealing temperature is within the range of 400 to 500° C. In various embodiments, the annealing temperature includes various sub-ranges within the range of 400 to 500° C. During the void formation, the height of the oxide spacers is increased by approximately 40%. After the voids are formed most of the excess oxide is removed using a chemical mechanical polishing (CMP) process. Sufficient oxide is left above the metal lines such that the capping layer is not removed during the polishing.

Figure 14D:
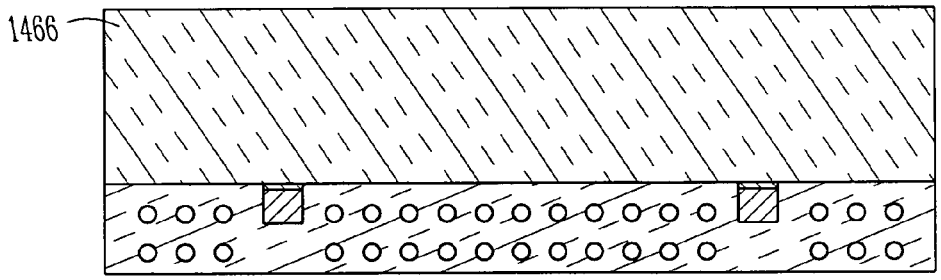
Figure 14E:
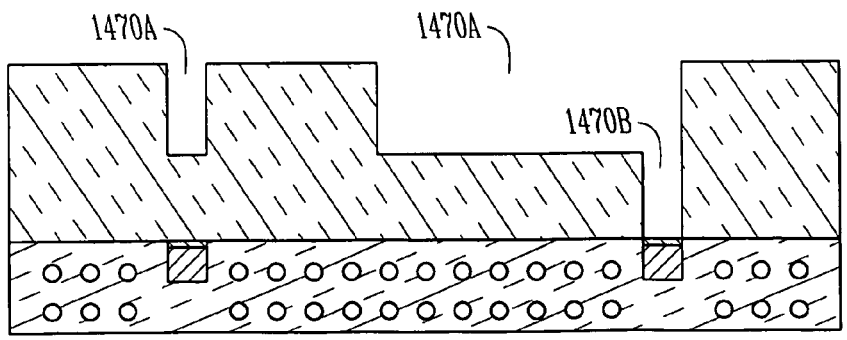
Figure 14F:
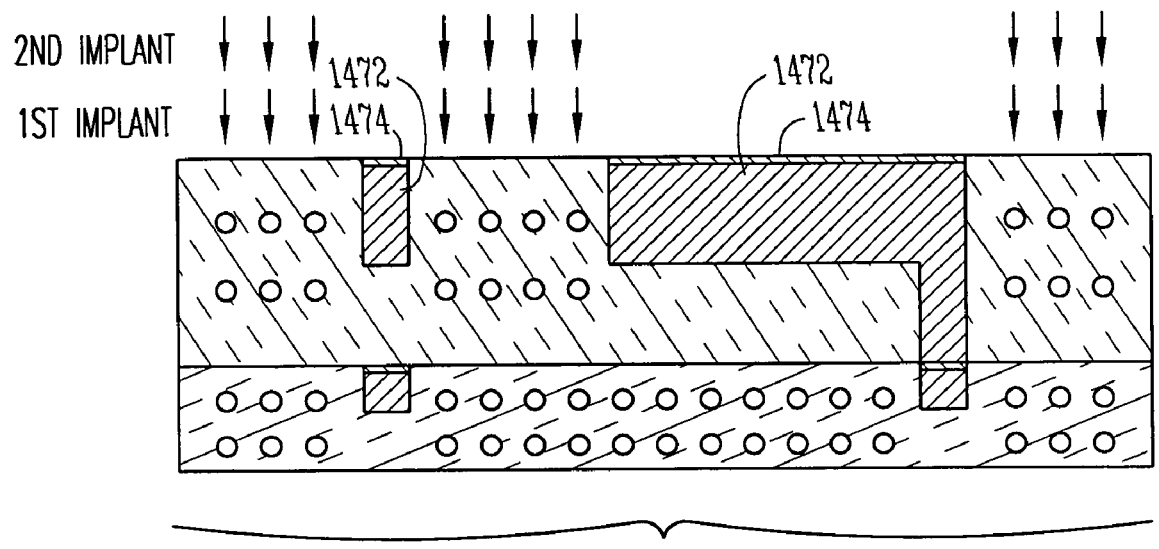

In FIG. 14D, a layer 1466 of oxide approximately 0.75 microns thick is applied followed by a touch-up CMP process to planarize the surface. The process described above is implemented to form trenches 1470A for the metallurgy 1472 and trenches 1470B for the first to second level vias. In this case, the ion-implants are $7.510^{15}/cm^2$ at 25 KEV and $7.510^{15}/cm^2$ at 70 KEV. The structure is annealed at 400 to 500° C. until approximately 40% voids 1490 are formed. A CMP process is performed, as in the previous step.

Figure 14G:
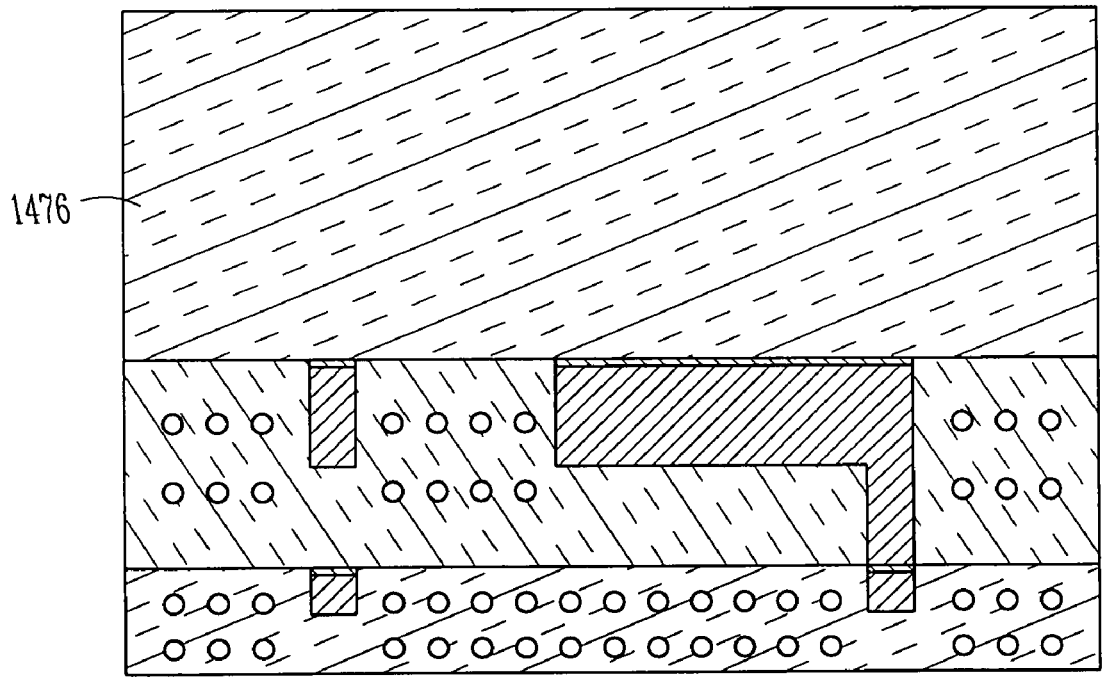
Figure 14H:
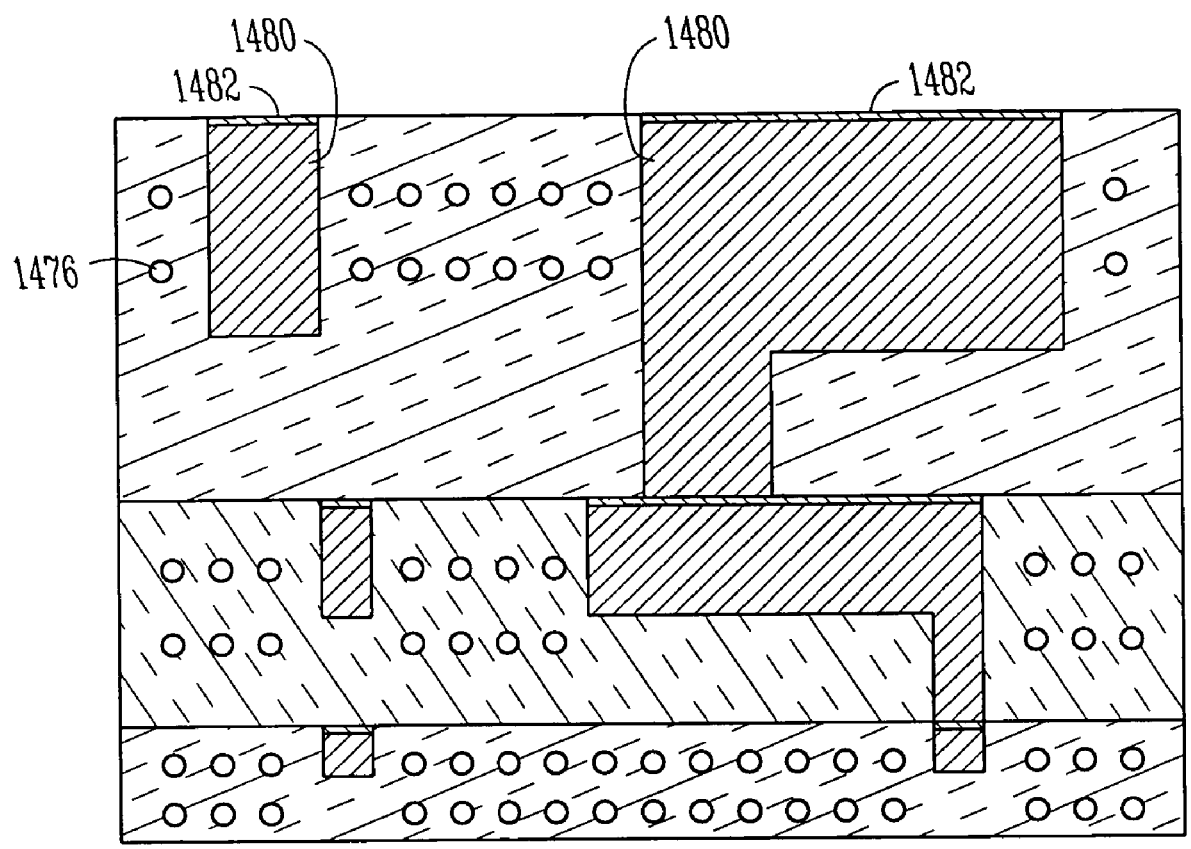

In FIG. 14G, an oxide film approximately 0.6 microns thick is applied, and the sequence of steps used to form the first level of metal are repeated to form the second level of metal 1480 and capping layer 1482 as shown in FIG. 14H. An oxide film approximately 0.75 microns thick is applied with processing similar to the first 0.75 micron film to form the second to third level via structure.

Figure 14I:
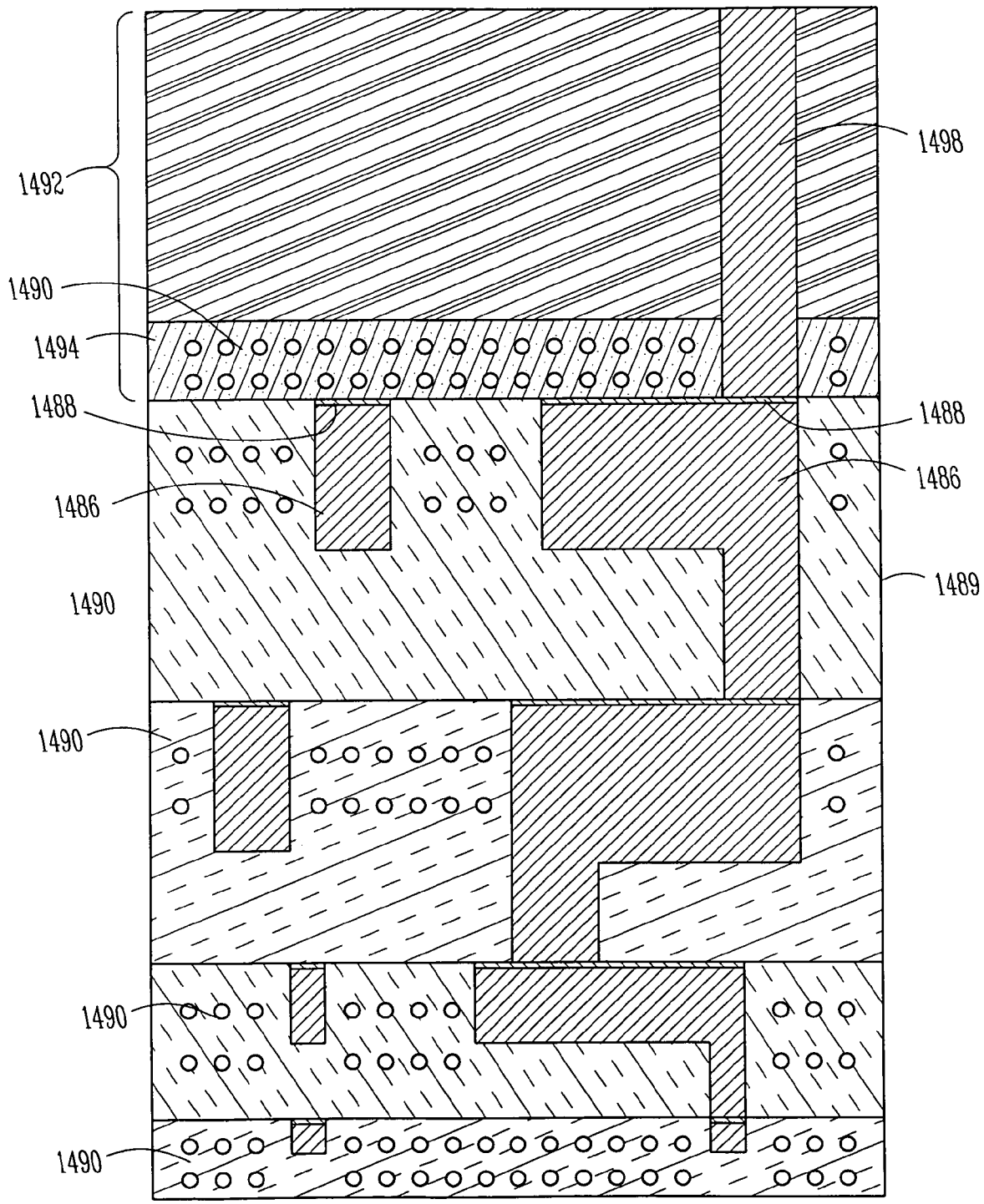

In FIG. 14I, a 1.5 micron film 1484 is deposited and patterned to form the troughs for the third metal level 1486 and capping layer 1488. The metal is deposited and patterned using a process similar to that for the first two levels except for the greater metal thickness. Implants of $7.510^{15}/cm^2$ at 45, 90, 170 and 280 KEV are performed, and the structure is annealed. The excess oxide is removed again leaving the capping layer on the metallurgy undisturbed. This process is repeated to form the third to fourth level vias structures and the fourth metal level. The final layer of oxide 1494 approximately 0.5 micron thick and the Polyimide layer 1496 are deposited and terminal vias 1498 are etched.

In this process sequence, a single damascene process is used in contrast to the dual damascene process used in the first process illustrated above. A dual damascene process may exert too high a stress on the metal layers being formed because of the swelling which occurs during the formation of the vias. However, if the process to form the pores is run at a temperature sufficiently high, the glass flows sufficiently to provide a low stress. Thus, in various embodiments which use a relatively low melting glass and a high temperature metal such as tungsten, a dual damascene process is capable of being used.

System Level

Figure 15:
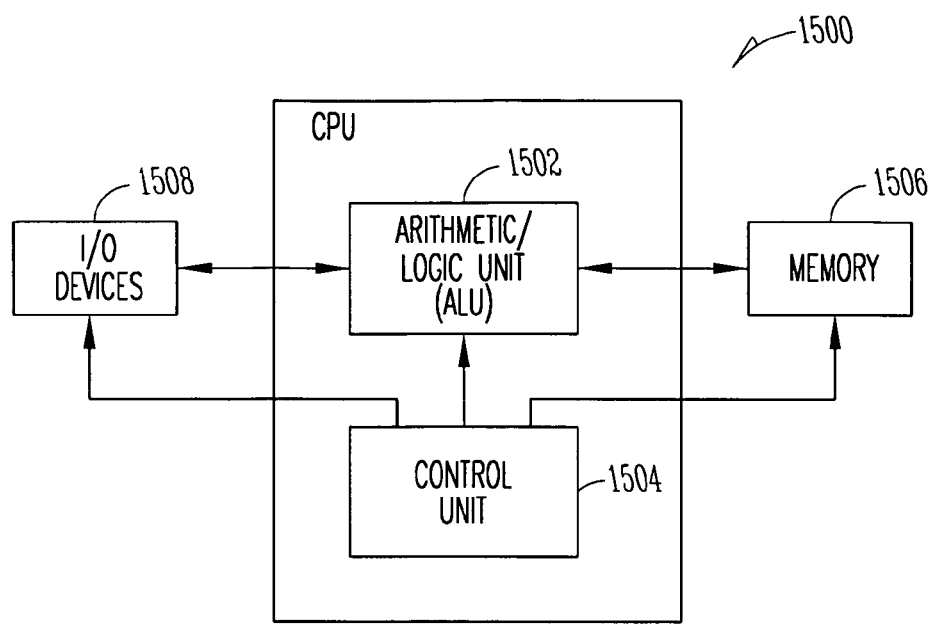
FIG. 15 is a simplified block diagram of a high-level organization of various embodiments of an electronic system according to the present subject matter.

FIG. 15 is a simplified block diagram of a high-level organization of various embodiments of an electronic system according to the present subject matter. In various embodiments, the system 1500 is a computer system, a process control system or other system that employs a processor and associated memory. The electronic system 1500 has functional elements, including a processor or arithmetic/logic unit (ALU) 1502, a control unit 1504, a memory device unit 1506 and an input/output (I/O) device 1508. Generally such an electronic system 1500 will have a native set of instructions that specify operations to be performed on data by the processor 1502 and other interactions between the processor 1502, the memory device unit 1506 and the I/O devices 1508. The control unit 1504 coordinates all operations of the processor 1502, the memory device 1506 and the I/O devices 1508 by continuously cycling through a set of operations that cause instructions to be fetched from the memory device 1506 and executed. According to various embodiments, the memory device 1506 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include a chip produced with the low-K ILD in accordance with the present subject matter.

Figure 16:
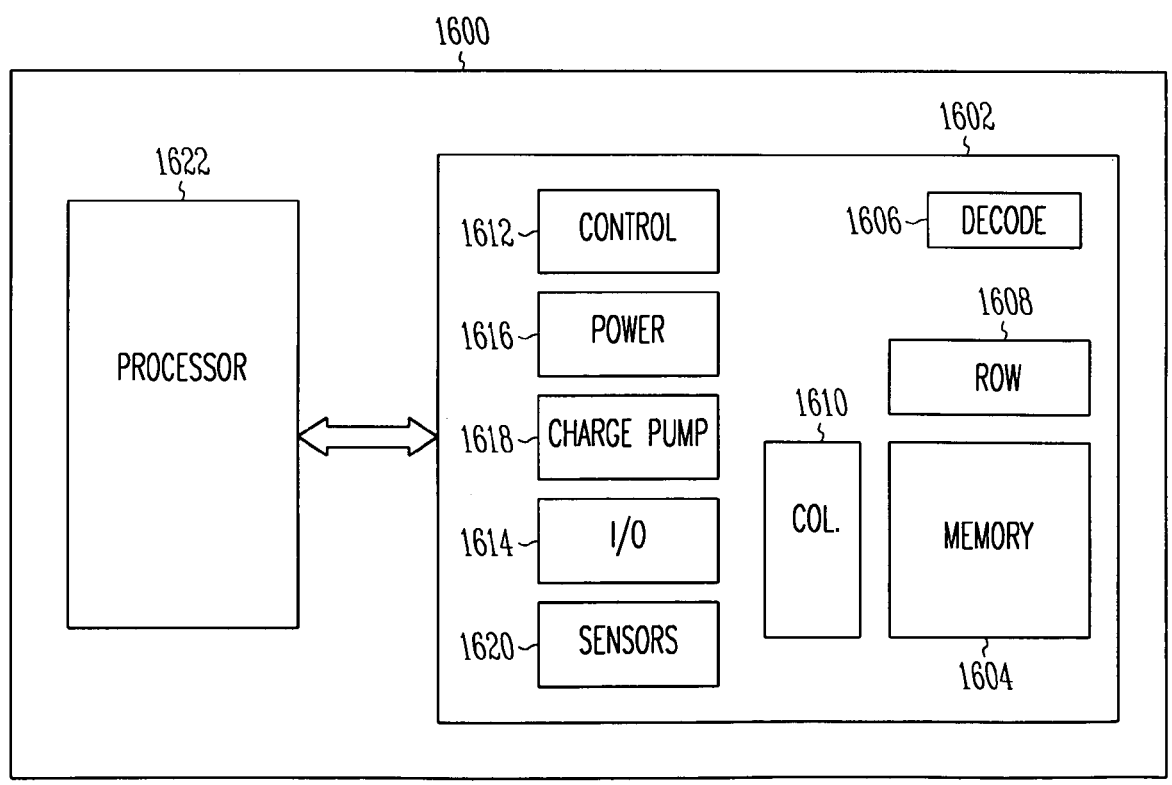
FIG. 16 is a simplified block diagram of a high-level organization of various embodiments of an electronic system according to the present subject matter.

FIG. 16 is a simplified block diagram of a high-level organization of various embodiments of an electronic system according to the present subject matter. The system 1600 includes a memory device 1602 which has an array of memory cells 1604, address decoder 1606, row access circuitry 1608, column access circuitry 1610, control circuitry 1612 for controlling operations, and input/output circuitry 1614. The memory device 1602 further includes power circuitry 1616, a charge pump 1618 for providing the higher-voltage programming pulses, and sensors 1620 such as current sensors for determining whether a memory cell is in a low-threshold conducting state or in a high-threshold non-conducting state. Also, as shown in FIG. 16, the system 1600 includes a processor 1622, or memory controller for memory accessing. The memory device 1602 receives control signals 1624 from the processor 1622 over wiring or metallization lines. The memory device 1602 is used to store data which is accessed via I/O lines. It will be appreciated by those skilled in the art that additional circuitry and control signals can be provided, and that the memory device 1602 has been simplified to help focus on the invention. At least one of the processor 1622 or memory device 1602 has the low-K ILD according to the present subject matter.

The illustration of system, as shown in FIG. 16, is intended to provide a general understanding of one application for the structure and circuitry of the present subject matter, and is not intended to serve as a complete description of all the elements and features of an electronic system using low-K ILD according to the present subject matter. As one of ordinary skill in the art will understand, such an electronic system can be fabricated in single-package processing units, or even on a single semiconductor chip, in order to reduce the communication time between the processor and the memory device.

Applications containing the low-K ILD as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

The present subject mater relates to improved interlayer dielectric (ILD) devices and methods of formation. The present subject matter provides methods for forming voids in the ILD after the metal layer has been formed so as to alleviate the demands placed upon a process for producing a porous structure. The present subject matter is particularly useful as photolithographic dimensions continue to decrease. In a first scheme, the insulator is a multi-phase structure. After the insulator is patterned, at least one of the phases is removed leaving the matrix phase intact. The intact matrix phase continues to provide structural rigidity and the spaces where the second (or multiple phases in the case of three phase or more complex structure) are now filled with air or other gas. A second process scheme introduces a gas phase (e.g. an inert gas such as helium (He), argon (Ar), or nitrogen ($N_2$)) into the insulator after it is in the solid state. The introduced gas phase also can include air.

One aspect of the present subject matter relates to a method for forming an interlayer dielectric (ILD). According to various embodiments of the method, an insulator is formed, at least one trench is formed in the insulator, and a metal layer is formed in the at least one trench. Voids are formed in the insulator layer after the metal layer is formed.

According to various embodiments of the method, a multiphase matrix is formed as an insulator layer. At least one trench is formed in the insulator layer and a metal layer is then formed in the at least one trench. At least one phase is at least partially removed from the multiphase matrix to form voids in the insulator layer.

According to various embodiments of the method, an insulator layer is formed, at least one trench is formed in the insulator, and a metal layer is formed in the at least one trench. After forming the metal layer, an inert gas is implanted and the insulator layer is annealed in an inert ambient to form a number of voids in the insulator layer.

One aspect of the present subject matter relates to an integrated circuit. According to various embodiments, the integrated circuit includes an insulator structure having a plurality of voids that have a maximum size, and a metal layer formed in the insulator structure. The metal layer has a minimum photo dimension. The maximum size of the voids is larger than the minimum photo dimension of the metal layer. Thus, a maximum-sized void is capable of extending between a first metal line and a second metal line in the metal layer.

This disclosure refers to several figures that resemble flow diagrams. One of ordinary skill in the art will understand, upon reading and comprehending this disclosure, that the methods related to the flow diagrams may occur in the order as illustrated in the flow diagrams, and may be ordered in another manner. Thus, the present subject matter is not limited to a particular order or logical arrangement.

Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. An electronic system, comprising:
   a processor; and
   a memory coupled to the processor,
   wherein the processor and the memory are formed by a method including forming an interlayer dielectric (ILD), including:
   forming an insulator layer;
   forming at least one trench in the insulator layer;
   forming a metal layer in the at least one trench having substantially smooth surfaces; and
   after forming the metal layer, forming a plurality of substantially curved gas filled voids beside the metal layer having an average size substantially smaller than a metal to metal distance in the insulator layer;

wherein forming the insulator layer includes forming an insulator layer with a multiphase structure; and forming voids in the insulator layer includes at least partially removing at least one phase from the multiphase structure; and wherein:

forming the insulator layer with a multiphase structure includes forming a carbon-containing glass layer; and at least partially removing at least one phase from the multiphase structure includes at least exposing the carbon-containing glass layer to an oxygen ($O_2$) containing environment with an elevated temperature to form carbon dioxide ($CO_2$) voids.

2. An electronic system, comprising:

at least one semiconductor circuit including at least an interlayer dielectric (ILD) formed by a method including:

forming a multiphase matrix as an insulator layer;

forming at least one trench in the insulator layer;

forming a metal layer in the at least one trench; and at least partially removing at least one phase from the multiphase matrix to form a plurality of substantially curved carbon dioxide ($CO_2$) filled voids having an average size substantially smaller than a metal to metal distance in the insulator layer.

3. The electronic system of claim 2, wherein:

forming a multiphase matrix includes forming glass with carbon particles; and at least partially removing at least one phase from the multiphase matrix to form voids in the insulator layer includes exposing the insulator layer to an oxygen ($O_2$) containing environment at an elevated temperature to form carbon dioxide ($CO_2$) voids in the insulator layer.

4. The electronic system of claim 3, wherein forming a multiphase matrix includes mixing fritted glass particles with graphite particles.

5. The electronic system of claim 2, wherein the at least partially removing at least one phase from the multiphase matrix to form voids in the insulator layer includes at least one of exposing the insulator layer to an oxygen ($O_2$) containing plasma environment, heating at least the insulator layer to a specified elevated temperature to form carbon dioxide filled voids, heating the insulator with at least one of infrared radiation, light radiation, laser, plasma, rapid thermal anneal (RTA), and combinations thereof.

6. An electronic system, comprising:

a processor; and a memory coupled to the processor, wherein the processor and the memory are formed as at least one integrated circuit, including:

a plurality of devices;

an insulator structure positioned over the plurality of devices, wherein the insulator structure has a plurality of substantially curved gas filled voids that have a maximum size, and comprise at least one of glass, and a multiphase structure that includes a glass phase and a carbon phase, wherein the carbon phase has been partially removed from the multiphase structure to form the voids in the insulator structure;

at least one metal level operatively coupled to the plurality of devices and formed in the insulator structure with a minimum photo dimension, wherein the maximum size of the voids is larger than the minimum photo dimension of the metal layer such that a maximum-sized void is capable of extending between a first metal line and a second metal line in the metal layer to expose less than all of a sidewall of the first metal line and the second metal line to the gas filled voids.

7. The system of claim 6, wherein the plurality of voids in the insulator structure contain at least one of carbon dioxide ($CO_2$) formed by oxidizing carbon contained in the insulator structure, at least one of ion implanted helium (He), argon (Ar), nitrogen ($N_2$) and air.

8. The system of claim 6, further comprising performing a rapid thermal anneal (RTA) on the multiphase matrix to provide the elevated temperature.

* * * * *